US012642140B2

(12) United States Patent  
Drillet et al.

(10) Patent No.: US 12,642,140 B2  
(45) Date of Patent: May 26, 2026

(54) ON CHIP INDUCTORS

(71) Applicant: X-FAB France SAS, Corbeil-Essonnes (FR)

(72) Inventors: Frederic Drillet, Corbeil-Essonnes (FR); Imene Lahbib, Corbeil-Essonnes (FR); Gregory U'Ren, Corbeil-Essonnes (FR)

(73) Assignee: X-FAB FRANCE SAS, Corbeil-Essonnes (FR)

( * ) Notice: Subject to any disclaimer, the term of this patent is extended or adjusted under 35 U.S.C. 154(b) by 401 days.

(21) Appl. No.: 18/142,801

(22) Filed: May 3, 2023

(65) Prior Publication Data

US 2023/0361102 A1     Nov. 9, 2023

(30) Foreign Application Priority Data

May 4, 2022    (FR) ..................................... 2204245  
Jun. 28, 2022    (GB) ................................... 2209455

(51) Int. Cl.
| | |
|---|---|
| *H10W 90/00* | (2026.01) |
| *H01F 27/28* | (2006.01) |
| *H03F 3/195* | (2006.01) |
| *H03F 3/20* | (2006.01) |

(52) U.S. Cl.  
CPC ............ *H10W 90/00* (2026.01); *H01F 27/28* (2013.01); *H03F 3/195* (2013.01); *H03F 3/20* (2013.01); *H03F 2200/294* (2013.01)

(58) Field of Classification Search  
CPC .. H01F 27/28; H01F 27/327; H01F 2017/048;

H01F 17/0006; H01L 25/50; H01L 25/162; H01L 21/6835; H01L 23/485; H01L 2221/68363; H01L 2221/68368; H03F 3/195; H03F 3/20; H03F 2200/294; H10D 1/20

See application file for complete search history.

(56) References Cited

U.S. PATENT DOCUMENTS

| | | | |
|---|---|---|---|
| 2006/0157798 A1* | 7/2006 | Hayashi ................. | H10D 84/40 |
| | | | 257/E29.022 |
| 2012/0161279 A1 | 6/2012 | Lin et al. | |
| 2014/0028543 A1 | 1/2014 | Lo et al. | |

(Continued)

FOREIGN PATENT DOCUMENTS

| | | |
|---|---|---|
| DE | 10 2016 118 223 A1 | 8/2017 |
| GB | 2583980 A | 11/2020 |

(Continued)

OTHER PUBLICATIONS

UK Intellectual Property Office, Search and Examination Report issued Dec. 23, 2022 which pertains to GB Application No. GB2209455. 1, filed Jun. 28, 2022; 9 pages.

(Continued)

*Primary Examiner* — Thanh Y. Tran  
(74) *Attorney, Agent, or Firm* — Thompson Hine LLP

(57) ABSTRACT

A semiconductor structure includes a semiconductor wafer having one or more semiconductor devices and an inductor attached to an upper surface of said semiconductor wafer. The semiconductor structure further includes a redistribution layer electrically connecting the inductor to at least one of said one or more semiconductor devices.

15 Claims, 6 Drawing Sheets

Legend
- ▨ Inductor Metal Core
- ▦ High permeability electric
- ■ SiON
- ◩ Top RDL
- ▦ Top passivation
- ⬚ SOI top metal
- ⊠ Silicon active area
- ▨ Buried oxide
- ▨ Silicon substrate
- ▤ Oxide
- ▨ µTP dielectric

(56)        References Cited

U.S. PATENT DOCUMENTS

| 2016/0141244 | A1 | 5/2016 | Song et al. |
| 2016/0240302 | A1 | 8/2016 | Tsai et al. |
| 2017/0256521 | A1 | 9/2017 | Cok et al. |
| 2018/0240797 | A1* | 8/2018 | Yokoyama ......... H10D 84/0149 |
| 2019/0385775 | A1 | 12/2019 | Roth et al. |
| 2020/0098621 | A1 | 3/2020 | Bharath et al. |
| 2020/0098676 | A1 | 3/2020 | Elsherbini et al. |

FOREIGN PATENT DOCUMENTS

| WO | 2010/131079 | A1 | 11/2010 |
| WO | 2022/012511 | A1 | 1/2022 |

OTHER PUBLICATIONS

Intellectual Property Office, Great Britain Examination Report issued Aug. 20, 2024, which pertains to Patent Application No. GB2209455.1. 3 pgs.

Intellectual Property Office of France, Preliminary Search Report issued Feb. 14, 2023 which pertains to French Patent Application No. FR2204245; 11 pgs.

* cited by examiner

36

38

42

38

ON CHIP INDUCTORS

This application claims priority to French Patent Application No. 2204245 filed on May 4, 2022 and United Kingdom Patent Application No. 2209455.1, filed on Jun. 28, 2022. The entire contents of both of these applications are hereby incorporated by reference.

TECHNICAL FIELD

The present disclosure concerns on chip inductors, and in particular inductors that are transfer printed from a native substrate to a target wafer.

BACKGROUND

High quality inductors are important for many RF applications such as Low Noise Amplifiers (LNAs) for achieving low noise and Power Amplifiers (PA) for achieving high power-added efficiency (PAE). Such inductors are often provided at the printed circuit board (PCB) level, because such surface mounted devices (SMDs) have traditionally been able to provide a significantly higher quality factor (Q) compared to integrated (on-chip) inductors.

SUMMARY

According to certain aspects of the invention there is provided a semiconductor structure and a method forming such as set out in the appended claims.

Embodiments are described below with reference to the accompanying drawings.

DETAILED DESCRIPTION

Figure 1:
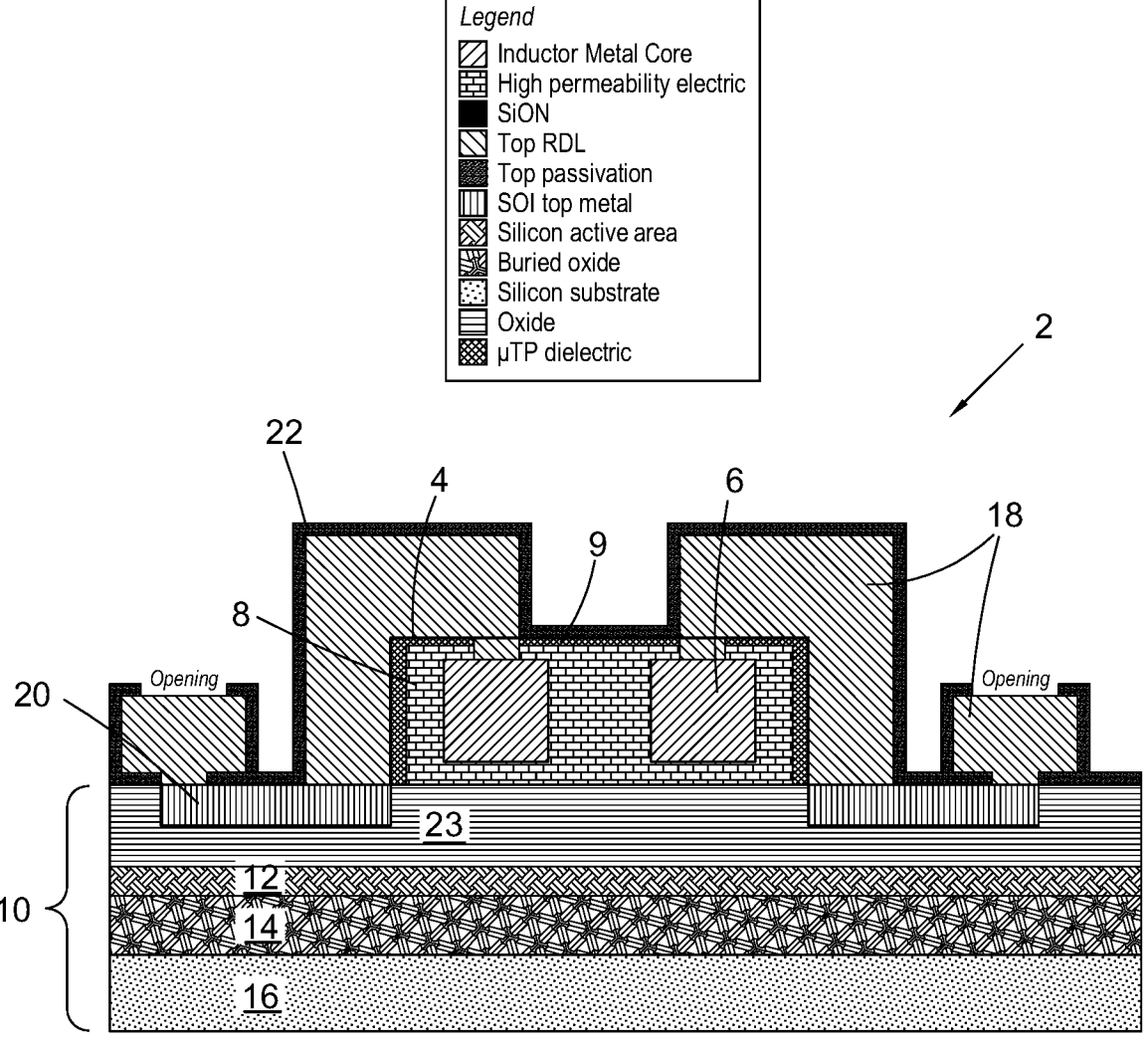
FIG. 1 shows a schematic cross section of a semiconductor structure with a µTP inductor on a SOI wafer according to an embodiment.

FIG. 1 shows a cross section of a semiconductor structure 2 according to an embodiment. The structure comprises a micro-transfer printed (µTP) inductor 4. The inductor 4 comprises a metal core 6, typically made of copper, surrounded by a high permeability dielectric layer 8 comprising cobalt nanoparticles. The dielectric layer with 8 with cobalt is typically covered by a thin dielectric layer 9 (e.g. silicon oxide) provided as part of the micro-transfer printing process before lifting the inductor 4 from the native substrate. The inductor 4 is attached to a target wafer 10 being a SOI wafer comprising metal layers and an active silicon layer 12 comprising semiconductor devices such as transistors and diodes formed by doped regions in the active silicon layer 12. The wafer comprises a buried oxide layer (BOX) 14 separating the top layer 12 from the underlying high resistivity bulk silicon 16. The inductor 4 is connected to the SOI technology by a top redistribution layer (RDL) 18 via a top metal layer 20 of the SOI wafer. A passivation layer 22 covers the semiconductor structure 2. Typically, the inductor 4 is attached on top of the back-end of line (BEOL) stack 23 of the SOI wafer. The BEOL stack 23 comprises metal layers (e.g. four or six metal layers including a top metal layer) separated by interstitial dielectric layers and connected by vias.

The cobalt nanoparticles in the dielectric layer 8 increase the relative magnetic permeability (w), which can increase the quality factor of the inductor 4. However, because the dielectric layer 8 would be adversely affected by the process temperatures required for forming semiconductor devices in the active silicon layer, forming the inductor directly on the wafer 10 would not provide the same advantageous device properties. Hence, the inductor 4 is formed separately on another substrate (the native substrate) and then transfer printed onto the target wafer 10, which has already been prepared. For example, the active silicon layer 12 may be populated in with semiconductor devices in a CMOS process and the inductor 4 may be transfer printed after completing the back end of line (BEOL) process.

Figure 2:
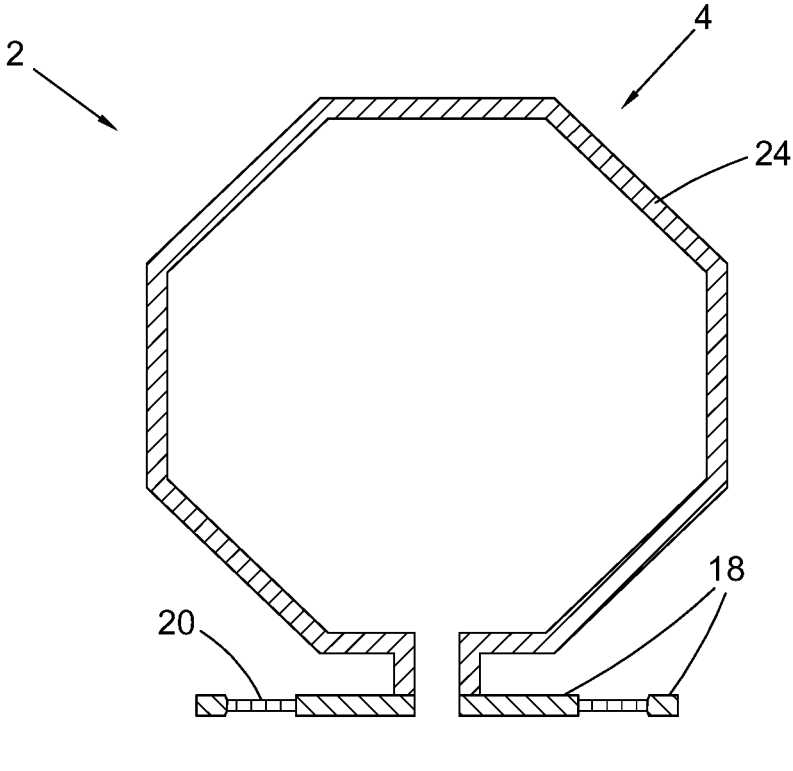
FIG. 2 shows a schematic top view of a semiconductor structure comprising an inductor with a single coil turn according to an embodiment.

FIG. 2 shows a top view of a semiconductor structure according to an embodiment, which may be the same embodiment illustrated in FIG. 1. The same reference numerals are used in different figures to denote similar or equivalent features to aid understanding and are not intended to limit the illustrated embodiments. The structure 2 comprises an inductor 4 containing a single coil turn 24. The inductor 4 is connected to a RDL 18, which electrically connects the inductor 4 to metal layer 20 of the target wafer.

Figure 3:
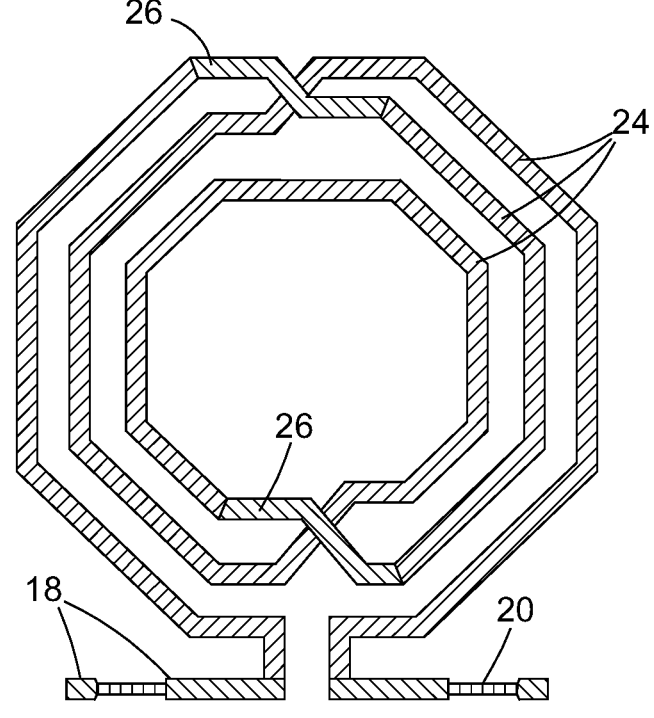
FIG. 3 shows a schematic top view of a semiconductor structure comprising an inductor with multiple coil turns according to an embodiment.

FIG. 3 shows a top view of a semiconductor structure 2 according to another embodiment, which may be the same embodiment as illustrated in FIG. 1. The structure 2 comprises an inductor 4 comprising three coil turns 24. The inductor 4 is connected to the RDL 18, which electrically connects the inductor 4 to metal layer 20 of the target wafer. The RDL 18 provides interconnections between the different turns 24 of the inductor 4.

Figure 4:
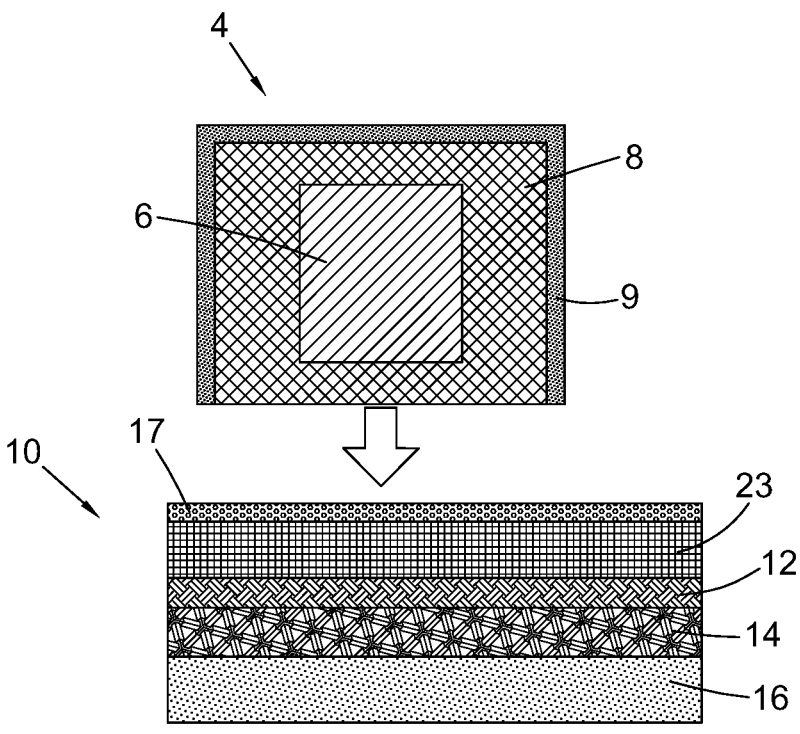
FIG. 4 shows a schematic diagram illustrating a method of forming a semiconductor structure according to an embodiment.

FIG. 4 shows a schematic diagram of the transfer process for transferring the inductor 4 from the native substrate (not shown) to the target wafer 10. The inductor 4 comprises a metal core 6 comprising copper and covered by a dielectric layer 8 comprising cobalt nanoparticles. The dielectric layer 8 is configured, by the density of cobalt nanoparticles, to have a relative permittivity of about three ($\mu_r \approx 3$). A µTP dielectric layer 9 covers the dielectric layer 8 with cobalt. The target wafer 10 being a SOI wafer comprises three layers being active silicon layer 12 at the top, the buried oxide layer 14 in the middle and the underlying bulk silicon layer 16. Semiconductor devices, such as transistors, diodes, well resistors etc. have already been formed in the active silicon layer 12 before the transfer process. This can solve the process incompatibility of the formation of the integrated inductor 4 and the SOI wafer. An adhesive (glue) layer 17 may be applied to the target wafer 10 or to the inductor 4 to attach the inductor 4 to the wafer 10. After attaching the inductor 4, an RDL (not shown) can be formed to electrically connect the inductor 4 to the target wafer 10. The SOI wafer 10 comprises an oxide layer 23 (and optionally metal layer(s) e.g. in a BEOL stack) on the active layer 12.

Four different inductors, including one according to an embodiment, were simulated and compared. The results are summarized in Table 1.

TABLE 1

| Inductor | Specification | L (pH) | R (Ω) | Q | Qmax | SRF (GHz) | Turns | OD (μm) |
|---|---|---|---|---|---|---|---|---|
| 1 | μTP with Cobalt (embodiment) | 925 | 0.549 | 21.2 | 55.8 | 61 | 1 | 320 |
| 2 | μTP without Cobalt (embodiment) | 754 | 0.532 | 17.8 | 49.8 | 67 | 1 | 320 |
| 3 | BEOL Cu 2 turns | 918 | 0.943 | 12.23 | 34 | 32 | 2 | 185 |
| 4 | BEOL Cu 1 turn | 738 | 0.69 | 13.2 | 48 | 59.6 | 1 | 320 |

Comparing inductors 1 and 2, the cobalt dielectric increases the inductance value for a given parasitic resistance and provides greater Q (at 2 GHz) and Qmax. Comparing inductors 1 and 3, for substantially the same inductance value, the parasitic resistance of the embodiment is almost half while the self-resonating frequency (SRF) is almost twice as great. The SRF provides an upper threshold for the frequency range of the inductor, above which the inductor does not behave like an inductor anymore. Comparing inductors 1 and 4, the inductors have the same dimensions and provide comparable performance, but inductor 1 provides a higher inductance value (by about +25%). Overall, the micro transfer printed inductor with a dielectric layer comprising cobalt provides the best performance.

Figure 5:
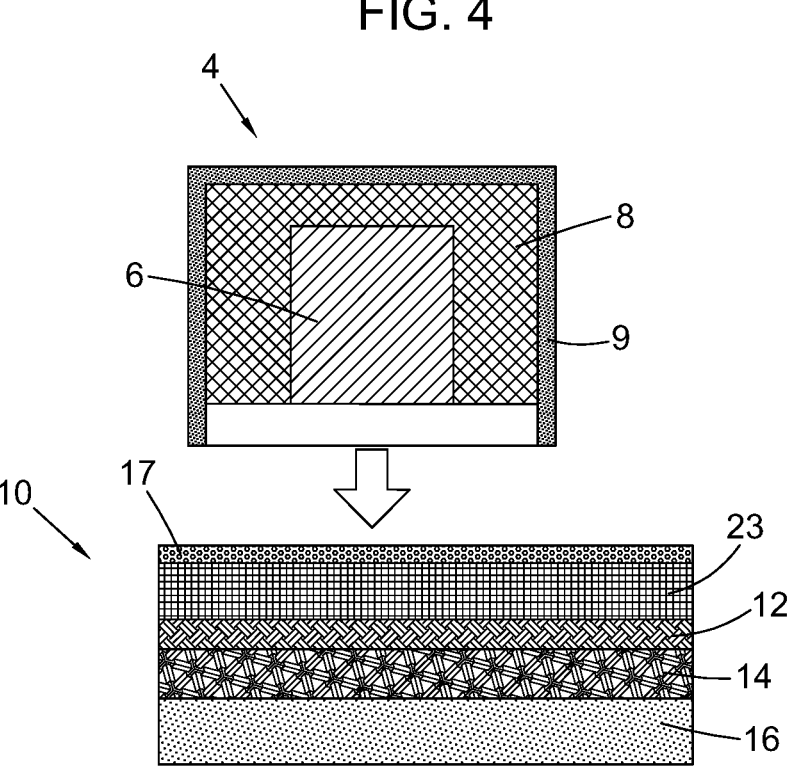
FIG. 5 shows a schematic diagram illustrating a method of forming a semiconductor structure according to another embodiment.

FIG. 5 illustrates an alternative process, wherein the inductor 4 comprises a dielectric layer 8 comprising SiON (without cobalt) on one side of the metal core 6, which is attached to the target wafer 10. By not surrounding the whole metal core 6 of the inductor with dielectric comprising cobalt, the step of forming the inductor on the native wafer may be simplified. For example, the copper of the metal core 6 may be deposited on a layer of SiON followed by deposition or coating of the copper with a dielectric material comprising cobalt nanoparticles. The layer of SiON can be attached to the target wafer 10 by an adhesive layer 17 on the wafer 10. A μTP dielectric layer 9 covers the inductor 4.

Figure 6:
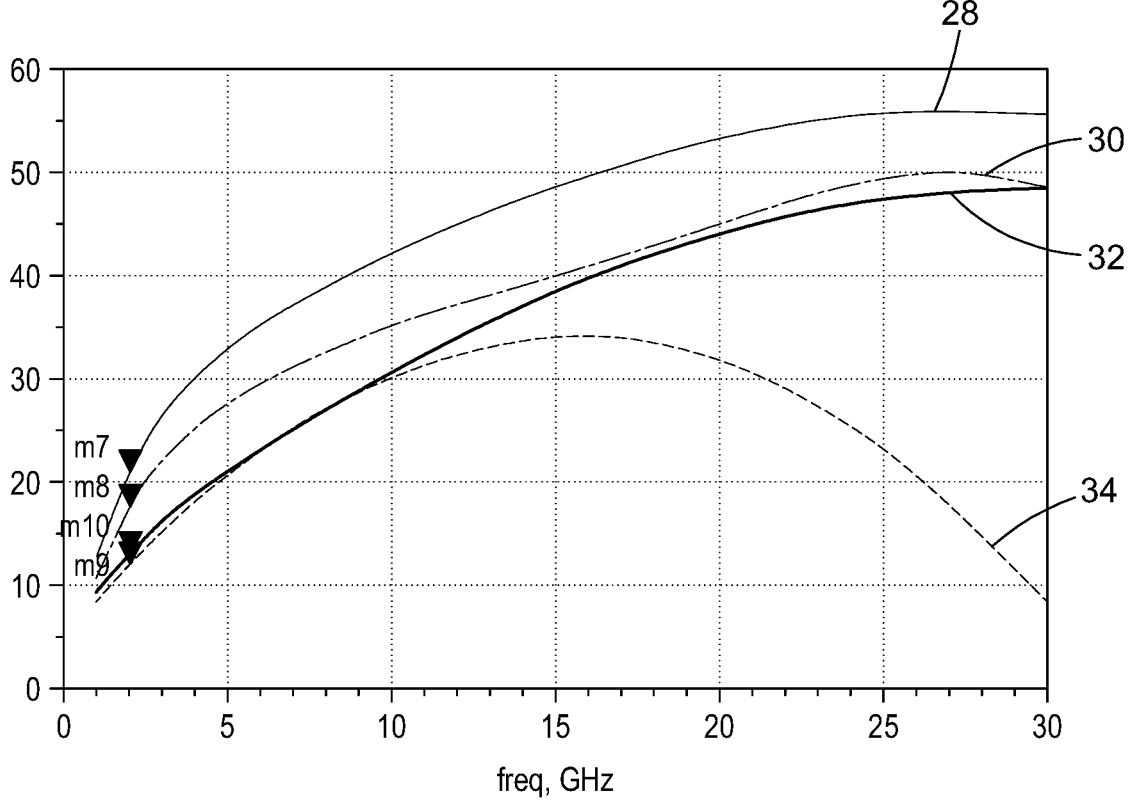
FIG. 6 shows a graph plotting the quality factor of different inductors as a function of frequency.

FIG. 6 shows a graph comparing the quality factor of the four inductors from Table 1. Trace 28 corresponds to inductor 1 (μTP with Cobalt) of Table 1, trace 30 corresponds to inductor 2 (μTP without Cobalt), trace 32 corresponds to inductor 4 (MIMJ 1 turn), and trace 34 corresponds to inductor 3 (MIMJ 2 turns). As can be seen from the graph, the quality factor of the transfer printed inductor 28 with a dielectric layer comprising cobalt has a higher quality factor across the whole frequency spectrum. At 2 GHz, which is a frequency of interest for may applications, the quality factor of the embodiment is 21.2, while the closest other inductor has a quality factor of 17.8.

Figure 7:
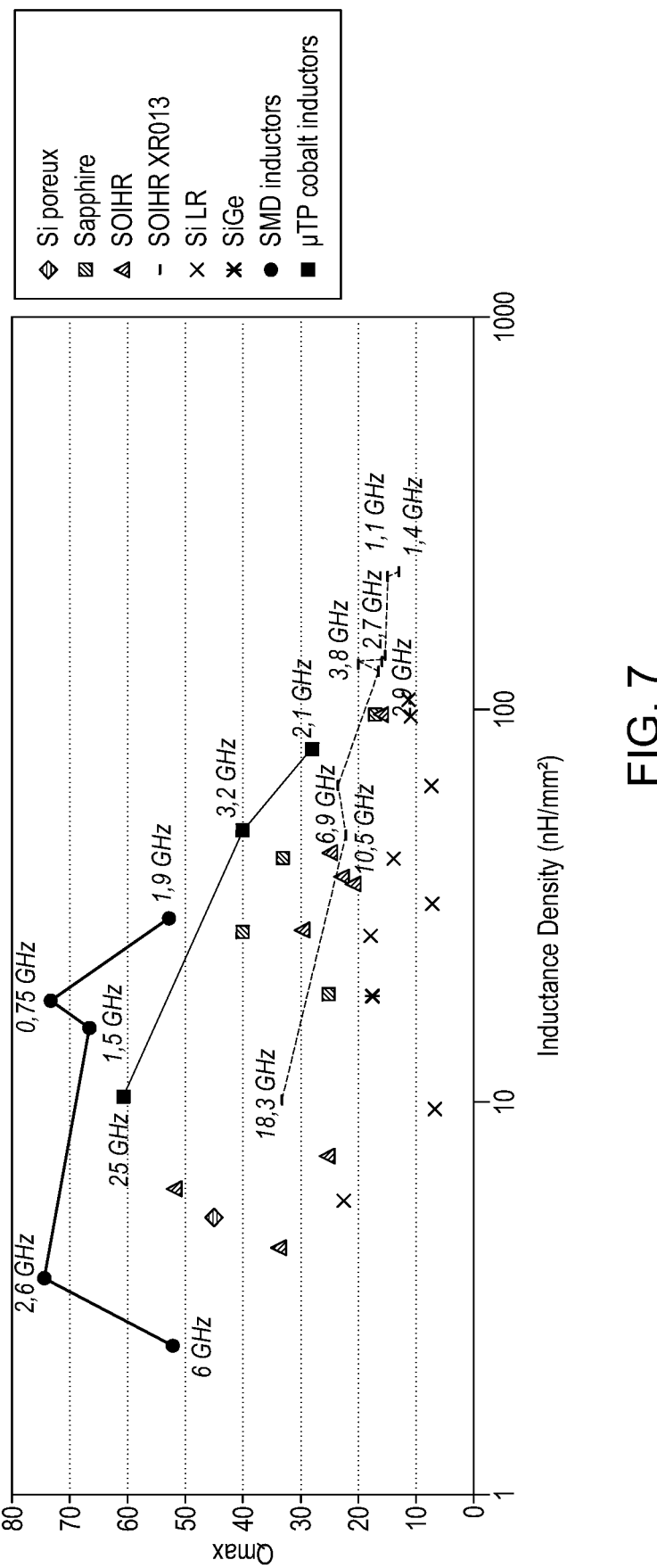
FIG. 7 shows a graph plotting the maximum quality factor as a function of inductance density.

FIG. 7 shows a graph that compares the Qmax of different inductors and the frequency at which Qmax occurs. In particular, the Qmax of three μTP inductors with cobalt are shown and compared to the Qmax of five different surface mounted devices from Murata. As can be seen, the μTP inductors with cobalt have a higher working frequency for a given inductance density compared to the SMDs. Also, from the graph, it is seen that the μTP inductors with cobalt have a higher maximum quality factor compared to any of the other integrated inductors.

Figure 8:
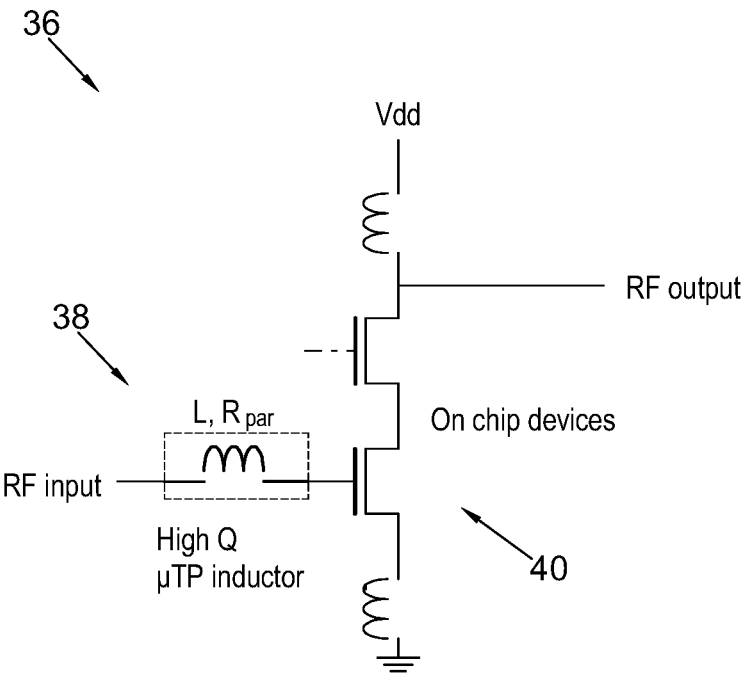
FIG. 8 shows a circuit diagram of a low noise amplifier.

FIG. 8 shows a circuit diagram of a low noise amplifier (LNA) 36 comprising an inductor 38 according to an embodiment. The LNA 36 comprises a cascode structure 40 comprising two transistors. The parasitic resistance of the input inductor 38 directly adds noise to the whole LNA 36. Hence, the noise figure (NF) of the input inductor~loss of the inductor. The μTP inductor 38 has a very high Q factor. For a given L, the parasitic resistance is lower for the μTP inductor compared to a conventional integrated inductor. Hence, the added inductor noise can be significantly lower for the μTP high Q inductor 38.

Figure 9:
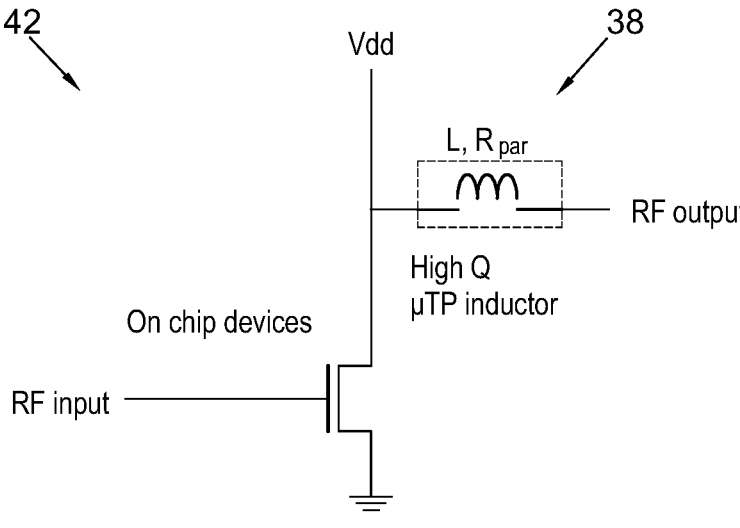
FIG. 9 shows a circuit diagram of a power amplifier.

FIG. 9 shows a circuit diagram of a power amplifier (PA) 42 comprising an inductor 38 according to an embodiment. The parasitic resistance of the output matching inductor 38 is directly degrading the power added efficiency (PAE) of the whole PA. 0.1 dB of loss in the output matching network causes 1 point of PAE. The greater the loss of the inductor, the lower RFout. The μTP inductor 38 can have a very high Q factor. For a given L, the parasitic resistance can be lower for the μTP inductor 38 compared to a conventional integrated inductor. Hence, the loss of the PA can be significantly lower for the μTP high Q inductor 38.

In general, embodiments disclosed herein provide a semiconductor structure (typically a chip or a part of a chip) comprising a semiconductor wafer comprising one or more semiconductor devices (e.g. transistors and diodes formed by doped regions in the wafer), an inductor attached to said semiconductor wafer (typically attached to the BEOL stack of the target wafer), and a redistribution layer electrically connecting the inductor to at least one of said one or more semiconductor devices. Typically the RDL is formed by copper lines connecting the inductor to the wafer or, more specifically, to the back end of line (BEOL) stack on the wafer. For example, the BEOL stack of the wafer may comprise a top metal layer connected to the one or more devices in an active layer of the wafer, and the RDL can connect the inductor to said metal layer. A passivation layer may cover the RDL and may comprise openings for forming further off-chip connections. The inductor is an integrated inductor, directly attached to the semiconductor wafer, and not a, so called, surface mounted device (SMD), which can be connected to a chip via external connections (e.g. soldered wires) to a printed circuit board (PCB).

The semiconductor structure can allow for high quality factor inductors at chip level (i.e. integrated inductors rather than SMDs). The described embodiments can provide improved device performance, for example, by shorter interconnections (provided by the RDL) with a similar quality factor compared to SMD technology. The embodiments can also provide improved integration, as there is no need to have (external) SMD inductors at the PCB level.

The inductor typically comprises a metal core (e.g. made of copper) and a dielectric layer at least partly covering said metal core. The dielectric layer may be located around the entire length of the inductor coil. The dielectric layer may have a thickness in the range of 2 μm to 40 μm. In one case, the dielectric layer comprises cobalt nanoparticles, which can increase the relative magnetic permeability of the dielectric layer and thereby the induction of the inductor. For example, the density/amount of cobalt can be configured to provide a relative magnetic permeability of about 3. The dielectric layer can comprise a carbon-coated cobalt polystyrene (Co/C-PS) nanocomposite film. The dielectric layer may comprise a layer of SiON on a side of said metal core facing said semiconductor wafer. When forming the inductor, the metal core can be formed on a SiON layer, which is lifted onto the target wafer when transferring the inductor from the native substrate. In this embodiment, and if the metal core has a substantially rectangular cross section (perpendicular to the direction of current flow), the dielectric material with cobalt can cover three sides (left, top and right) while the SiON (without cobalt) can cover the fourth side (bottom), which is attached to the semiconductor wafer.

The inductor may contain a single coil turn, which provides a lower inductance value than a multi turn coil, but which can simplify the manufacturing process and provide a low complexity solution. A single turn can also provide a higher SRF compared to multiple turns, as the parasitic capacitance between multiple turns can significantly decrease the SRF. Alternatively, the inductor can comprise multiple coil turns (e.g. 2, 3 or 4 turns). For multiple turns, a second RDL can be used to connect the turns without shorting.

The semiconductor wafer can be a silicon on insulator, SOL wafer. For example, the wafer may comprise a top layer being an active silicone layer comprising said semiconductor devices. The semiconductor devices may be formed by doping the SOI wafer before attaching the inductor. The wafer may comprise a plurality of metal layers connected to the semiconductor devices. The RDL can then be connected to the top metal layer of the plurality of metal layers.

The semiconductor structure may further comprise an adhesive layer between said inductor and said semiconductor wafer. The adhesive layer secures the inductor to the wafer after transferring the inductor from its native substrate. The adhesive layer may comprise at least one of Benzocyclobutene (BCB) and a photodielectric material such as InterVia™.

Other embodiments provide a low noise amplifier (LNA) comprising a semiconductor structure as described herein, wherein the inductor is an input inductor of the LNA and at least one of the semiconductor devices of the target wafer is a transistor connected to the inductor. For example, the LNA may comprise a cascode structure with a common emitter (or source) and a common base/gate wherein the inductor is connected to the base/gate of the common emitter or source.

Another embodiment provides a power amplifier (PA) comprising a semiconductor structure as described herein, wherein the inductor is an output inductor of the PA and at least one of the semiconductor devices is a transistor connected to the inductor.

Disclosed herein is also a method of forming a semiconductor structure, such as the semiconductor structure described above. The method comprises forming an inductor on a substrate (the native substrate), forming one or more semiconductor devices in a wafer (the target wafer, e.g. a SOI wafer), and transferring said inductor from said substrate onto said wafer (typically on to the BEOL stack of the target wafer. The method further comprises forming a redistribution layer electrically connecting said inductor to at least one of said one or more semiconductor devices (e.g. via the top metal of the BEOL stack).

The step of forming the inductor can comprise providing a metal core and providing a dielectric layer at least partly covering said metal core. For example, copper may be deposited on the target wafer and then coated by a dielectric material with suspended cobalt nanoparticles.

The method may further comprise providing an adhesive layer on the inductor or on the target wafer before transferring. The step of transferring may comprise micro transfer printing, μTP.

While specific embodiments have been described herein, it will be apparent to a person skilled in the art that other embodiments may be provided that fall within the scope of the claims. Features of one embodiment may be appropriately combined with those of one or more other embodiments.

What is claimed is:

1. A semiconductor structure comprising:
   a semiconductor wafer comprising one or more semiconductor devices;
   an inductor attached to said semiconductor wafer, wherein said inductor comprises a metal core and a dielectric layer at least partly covering said metal core, and wherein said dielectric layer comprises cobalt nanoparticles; and
   a redistribution layer electrically connecting the inductor to at least one of said one or more semiconductor devices.

2. A semiconductor structure according to claim 1, wherein said dielectric layer is a carbon-coated cobalt polystyrene (Co/C-PS) nanocomposite film.

3. A semiconductor structure according to claim 1, wherein said dielectric layer comprises a layer of SiON on a side of said metal core facing said semiconductor wafer.

4. A semiconductor structure according to claim 1, wherein at least a part of said dielectric layer is configured to have a relative magnetic permeability of 3.

5. A semiconductor structure according to claim 1, wherein said inductor contains a single coil turn.

6. A semiconductor structure according to claim 1, wherein said inductor comprises multiple coil turns.

7. A semiconductor structure according to claim 1, wherein said semiconductor wafer is a silicon on insulator, SOI, wafer.

8. A semiconductor structure according to claim 1, further comprising an adhesive layer between said inductor and said semiconductor wafer.

9. A semiconductor structure according to claim 8, wherein said adhesive layer comprises at least one of Benzocyclobutene (BCB) and a photodielectric material.

10. A semiconductor structure according to claim 8, wherein said inductor is directly attached to said semiconductor wafer by said adhesive layer.

11. A low noise amplifier, LNA, comprising a semiconductor structure according to claim 1, wherein said inductor is an input inductor of said LNA and at least one of said semiconductor devices is a transistor connected to said inductor.

12. A power amplifier, PA, comprising a semiconductor structure according to claim 1, wherein said inductor is an output inductor of said PA and at least one of said semiconductor devices is a transistor connected to said inductor.

13. A method of forming a semiconductor structure, the method comprising:

forming an inductor on a substrate, wherein said inductor comprises a metal core and a dielectric layer at least partly covering said metal core, and wherein said dielectric layer comprises cobalt nanoparticles;

forming one or more semiconductor devices in a semiconductor wafer; and transferring said inductor from said substrate onto said semiconductor wafer; and forming a redistribution layer electrically connecting said inductor to at least one of said one or more semiconductor devices.

14. A method according to claim 13, further comprising providing an adhesive layer on said semiconductor wafer before said step of transferring.

15. A method according to claim 13, wherein said step of transferring comprises micro transfer printing, µTP.

* * * * *